United States Patent
Ding et al.

(10) Patent No.: US 12,226,834 B2
(45) Date of Patent: Feb. 18, 2025

(54) METHOD FOR LASER-INDUCED GROWTH OF NANO-UNITS TO FORM ORIENTED, CHIRAL, AND COMPLEX STRUCTURES

(71) Applicant: WUHAN UNIVERSITY, Wuhan (CN)

(72) Inventors: Tao Ding, Wuhan (CN); Xiaolin Lu, Wuhan (CN)

(73) Assignee: WUHAN UNIVERSITY, Wuhan (CN)

( * ) Notice: Subject to any disclaimer, the term of this patent is extended or adjusted under 35 U.S.C. 154(b) by 556 days.

(21) Appl. No.: 17/535,566

(22) Filed: Nov. 24, 2021

(65) Prior Publication Data
US 2022/0126364 A1  Apr. 28, 2022

Related U.S. Application Data

(63) Continuation of application No. PCT/CN2021/073205, filed on Jan. 22, 2021.

(30) Foreign Application Priority Data

Oct. 28, 2020 (CN) .......................... 202011174634.0

(51) Int. Cl.
*B22F 9/20* (2006.01)
*C23C 14/02* (2006.01)
(Continued)

(52) U.S. Cl.
CPC .............. *B22F 9/20* (2013.01); *C23C 14/025* (2013.01); *C23C 14/16* (2013.01); *C23C 14/24* (2013.01);
(Continued)

(58) Field of Classification Search
None
See application file for complete search history.

(56) References Cited

U.S. PATENT DOCUMENTS 9,101,007 B2   8/2015  Hosseini
9,551,079 B2 * 1/2017  Cooks ....................... C25C 7/00
(Continued)

FOREIGN PATENT DOCUMENTS

CN  1438168 A    8/2003
CN  103769609 A  5/2014
(Continued)

OTHER PUBLICATIONS

Internation Search Report of PCT/CN2021/073205, Mailed Jul. 28, 2021.

*Primary Examiner* — George Wyszomierski
(74) *Attorney, Agent, or Firm* — True Shepherd LLC; Andrew C. Cheng

(57) ABSTRACT

A method for laser-induced growth of nano-units to form oriented, chiral, and complex structures is provided. Through a laser-induced photochemical reaction, a metal precursor undergoes photolysis to produce inorganic nanoparticles, and these nanoparticles are orientally deposited on a substrate along a polarization direction in a linearly polarized laser to form fusiform nano-units. Through mixed polarized light generated by a vortex plate, the nano-units can grow rapidly and form a specific arrangement to obtain special three-dimensional (3D) nanostructures with chiral features and complex patterns. This method can be implemented in a room temperature environment, has the characteristics of simple operation, short reaction time, high repeatability, long storage time, low cost, and controllable orientations and sites, and shows promising application prospects in the fields of optical devices, chiral catalysis, sensing, integrated circuits, and the like.

5 Claims, 8 Drawing Sheets

(51) Int. Cl.
*C23C 14/16* (2006.01)
*C23C 14/24* (2006.01)
*B82Y 30/00* (2011.01)
*B82Y 40/00* (2011.01)

(52) U.S. Cl.
CPC ..... *B22F 2301/255* (2013.01); *B22F 2304/05* (2013.01); *B82Y 30/00* (2013.01); *B82Y 40/00* (2013.01)

(56) References Cited

U.S. PATENT DOCUMENTS

| | | | |
|---|---|---|---|
| 10,369,663 | B1 | 8/2019 | Geerlings et al. |
| 2005/0235777 | A1* | 10/2005 | Yamada ................ B82Y 30/00 75/345 |
| 2010/0248297 | A1 | 9/2010 | Hwu et al. |

FOREIGN PATENT DOCUMENTS

| | | |
|---|---|---|
| CN | 104743509 A | 7/2015 |
| CN | 105220117 A | 1/2016 |
| CN | 105499792 A | 4/2016 |
| CN | 105642913 A | 6/2016 |
| CN | 105977446 A | 9/2016 |
| CN | 108568594 A | 9/2018 |
| CN | 110044979 A | 7/2019 |
| JP | 5116100 B2 | 1/2013 |

* cited by examiner

ID chiral growth of fusiform gold
METHOD FOR LASER-INDUCED GROWTH OF NANO-UNITS TO FORM ORIENTED, CHIRAL, AND COMPLEX STRUCTURES

CROSS-REFERENCE TO RELATED APPLICATIONS

This application is a continuation of International Patent Application No. PCT/CN2021/073205 with a filing date of Jan. 22, 2021, designating the United States, now, and further claims priority to Chinese Patent Application No. 202011174634.0 with a filing date of Oct. 28, 2020. The content of the aforementioned applications, including any intervening amendments thereto, are incorporated herein by reference.

TECHNICAL FIELD

The present disclosure belongs to the field of nanomaterial preparation, and specifically relates to a method for laser-induced growth of nano-units to form oriented, chiral, and complex structures.

BACKGROUND

Anisotropic nanomaterials are materials whose sizes, compositions, and properties are related to directions, which can undergo self-organization to form one-dimensional (1D), two-dimensional (2D), and three-dimensional (3D) ordered structures, thereby exhibiting unique physical and chemical properties. Anisotropic nanomaterials show promising application prospects in fields such optics, electricity, magnetism, sensing, and biomedicine.

Traditional methods for preparing anisotropically-grown particles include seed or polyol-assisted synthesis (Nanotechnology 2008, 19, 015606; Chem. Mater. 2007, 19, 1592-1600; J. Phys. Chem. C 2006, 111, 1123-30; Adv. Mater. 2007, 19, 3385-3391; Nano Lett. 2005, 5, 5, 885-891), bio-assisted synthesis (J. Phys. Chem. B 2005, 109, 15256-63), electrochemical deposition (Chem. Commun. 2006, 4090-4092; Cryst Growth Des. 2008, 8, 2598-602), template synthesis (Langmuir 2000, 16, 451-458), and the like. Among these methods, some require various chemical reagents as aids and a strict growth reaction environment; some involve long reaction time, low efficiency, and poor stability; some require complicated operations, high cost, and a seed crystal prepared in advance; and some require some chemical reagents as redox agents or stabilizers, in which case residue organics or other metal ions exist on the surface of an obtained nanostructure (Chem. Mater. 2007, 19, 1592-1600; Nature 2003. 425, 487-90), and thus the catalytic, conductive, and sensing properties will be compromised to different extents. Therefore, it has become a major challenge to find a precise, fast, concise, ligand-free, and controllable preparation method for anisotropic nanostructures.

A method of controlling the growth of nanomaterials through light is not only simple and fast, but can also precisely control a growth site and an orientation and achieve the selective growth of a nanostructure with a specific morphology at a specified site. However, oriented structures obtained by optical techniques in the prior arts are relatively simple, and it is impossible to obtain complex 3D pattern structures and chiral structures, which greatly limits the application in micro-nano optical devices, chiral metamaterials, and the like.

SUMMARY

In order to solve the above problems, the present disclosure provides a method for laser-induced growth of nano-units to form oriented, chiral, and complex structures, which can achieve direct growth of fusiform nano-units on a substrate simply through laser irradiation, and make the fusiform nano-units form a chiral spiral structure and a complex pattern through regulation.

To achieve the above objective, the present disclosure adopts the following solutions:

<Oriented Growth of Fusiform Gold Nano-Units>

The present disclosure provides a method for laser polarization-induced oriented growth of fusiform gold nano-units, including the following steps:

step 1. preparation of a gold substrate with a thermal evaporation instrument, vapor-depositing chromium on a silicon substrate as an adhesion layer, and vapor-depositing a gold layer to obtain a gold film as the substrate; and cutting the substrate into small pieces, and storing the small pieces in a dry box for further use;

step 2. preparation of a sample taking a small piece of the gold film, adding an appropriate amount of a chloroauric acid solution dropwise on the gold film with a pipette, and covering with a cover glass such that the gold film is completely immersed in the chloroauric acid solution to obtain the sample;

step 3. laser-induced oriented growth of single fusiform gold nanoparticles coupling a linearly polarized laser into an optical microscope, and focusing the linearly polarized laser on a surface of the gold film in the sample through an objective lens to conduct irradiation for 10 s to 25 s at an irradiation power of 3 mW to 6 mW, where a direction of the linearly polarized laser can be adjusted to obtain fusiform gold nanoparticles with a corresponding orientation. The optimal conditions for obtaining the fusiform particles are as follows: laser power: 4 mW, and time: 15 s.

<Chiral Growth of Fusiform Gold Nano-Units>

Further, the present disclosure also provides a method for laser polarization-induced chiral growth of fusiform gold nano-units, including the following steps:

step 1. preparation of a gold substrate with a thermal evaporation instrument, vapor-depositing chromium on a silicon substrate as an adhesion layer, and vapor-depositing a gold layer to obtain a gold film as the substrate; and cutting the substrate into small pieces, and storing the small pieces in a dry box for further use;

step 2. preparation of a sample taking a small piece of the gold film, adding an appropriate amount of a chloroauric acid solution dropwise on the gold film with a pipette, and covering with a cover glass such that the gold film is completely immersed in the chloroauric acid solution to obtain the sample;

step 3. laser polarization-induced chiral growth of fusiform gold converting 446 nm linearly polarized light into mixed polarized light by aligning the fast axis of a vortex plate in a degree ranging from 30° to 60° to the polarization, and focusing the mixed polarized light on a surface of the gold film in the sample through an objective lens to conduct irradiation for 90 s to 180 s at an irradiation power of 5 mW to 6 mW to obtain a chiral nanostructure composed of multiple fusiform gold nano-units.

Growth of Fusiform Gold Nano-Units to Form a Complex Pattern Structure

Further, the present disclosure also provides a method for laser polarization-induced growth of fusiform gold nano-units to form a complex pattern structure, including the following steps:

step 1. preparation of a gold substrate with a thermal evaporation instrument, vapor-depositing chromium on a silicon substrate as an adhesion layer, and vapor-depositing a gold layer to obtain a gold film as the substrate; and cutting the substrate into small pieces, and storing the small pieces in a dry box for further use;

step 2. preparation of a sample taking a small piece of the gold film, adding an appropriate amount of a chloroauric acid solution dropwise on the gold film with a pipette, and covering with a cover glass such that the gold film is completely immersed in the chloroauric acid solution to obtain the sample;

step 3. laser polarization-induced growth of fusiform gold to form a complex pattern converting linearly polarized light into radially or angularly polarized light by aligning the fast axis of a vortex plate either parallel or vertical to the polarization, and focusing the radially or angularly polarized light on a surface of the gold film in the sample through an objective lens to conduct irradiation for 90 s to 180 s at an irradiation power of 5 mW to 6 mW to obtain a complex pattern nanostructure composed of multiple fusiform gold nano-units.

Preferably, in step 1 of the above-mentioned <oriented growth of fusiform gold nano-units>, <chiral growth of fusiform gold nano-units>, and <growth of fusiform gold nano-units to form a complex pattern structure>, a chromium layer of 3 nm may be vapor-deposited as an adhesion layer, and a gold layer of 50 nm to 100 nm may be vapor-deposited.

Preferably, in step 3 of the above-mentioned <oriented growth of fusiform gold nano-units>, <chiral growth of fusiform gold nano-units>, and <growth of fusiform gold nano-units to form a complex pattern structure>, the irradiation laser may have a wavelength of 400 nm to 460 nm.

Growth of Platinous/Palladium Oxide Fusiform Nano-Pillars

Further, the present disclosure also provides a method for laser polarization-induced growth of platinous oxide or palladium oxide fusiform nano-pillars, including the following steps:

step 1. preparation of a sample soaking a silicon wafer in an aminopropyltriethoxysilane (APTS) solution for a few minutes, and cleaning the silicon wafer with deionized water; and adding an appropriate amount of a Pt or Pd precursor solution dropwise on the silicon wafer, and covering with a cover glass such that the silicon wafer is completely immersed in the Pt or Pd precursor solution to obtain the sample;

step 2. laser-induced oriented growth of fusiform pillars coupling a linearly polarized laser into an optical microscope, and focusing the linearly polarized laser on a surface of the silicon wafer in the sample through an objective lens to conduct irradiation for no less than 10 s at an irradiation power of 2 mW to 22 mW, where a direction of the linearly polarized laser can be adjusted to obtain fusiform nano-pillars with a corresponding orientation.

Growth of Platinous/Palladium Oxide Circular Nano-Pillars

Further, the present disclosure also provides a method for laser polarization-induced growth of platinous or palladium oxide circular nano-pillars, including the following steps:

step 1. preparation of a sample soaking a silicon wafer in an APTS solution for a few minutes, and cleaning the silicon wafer with deionized water; and adding an appropriate amount of a Pt or Pd precursor solution dropwise on the silicon wafer, and covering with a cover glass such that the silicon wafer is completely immersed in the Pt/Pd precursor solution to obtain the sample;

step 2. laser-induced oriented growth of circular pillars coupling a circularly polarized laser into an optical microscope, and focusing the circularly polarized laser on a surface of the silicon wafer in the sample through an objective lens to conduct irradiation for no less than 10 s at an irradiation power of 2 mW to 22 mW to obtain circular nano-pillars.

Preferably, in step 2 of the above-mentioned <growth of platinous/palladium oxide fusiform nano-pillars> and <growth of platinous/palladium oxide circular nano-pillars>, the irradiation laser may have a wavelength of 400 nm to 460 nm or 500 nm to 550 nm; when the laser wavelength of 400 nm to 460 nm is adopted (such as 446 nm), the irradiation power may be in a range of 2 mW to 6 mW and the irradiation time may be in a range of 10 s to 60 s; and when the laser wavelength of 500 nm to 550 nm is adopted (such as 523 nm), the irradiation power may be in a range of 8 mW to 22 mW and the irradiation time may be no less than 20 s.

Growth to Form a Platinous Oxide Complex Pattern

Further, the present disclosure also provides a method for laser polarization-induced growth to form a platinous or palladium oxide complex pattern structure, including the following steps:

step 1. preparation of a sample soaking a silicon wafer in an APTS solution for a few minutes, and cleaning the silicon wafer with deionized water; and adding an appropriate amount of a Pt or Pd precursor solution dropwise on the silicon wafer, and covering with a cover glass such that the silicon wafer is completely immersed in the Pt or Pd precursor solution to obtain the sample;

step 2. laser-induced growth to form a complex pattern converting linearly polarized light into radially or angularly polarized light by aligning the fast axis of a vortex plate either parallel or vertical to the polarization, and focusing the radially or angularly polarized light on a surface of the silicon wafer in the sample through an objective lens for irradiation to obtain a complex pattern nanostructure composed of multiple fusiform nano-units.

Growth to Form a Platinous/Palladium Oxide Chiral Structure I

Further, the present disclosure also provides a method for laser polarization-induced growth to form a platinous or palladium oxide chiral structure, including the following steps:

step 1. preparation of a sample soaking a silicon wafer in an APTS solution for a few minutes, and cleaning the silicon wafer with deionized water; and adding an appropriate amount of a Pt or Pd precursor solution dropwise on the silicon wafer, and covering with a cover glass such that the silicon wafer is completely immersed in the Pt or Pd precursor solution to obtain the sample;

step 2. laser-induced chiral growth of fusiform pillars coupling a linearly polarized laser into an optical microscope, and focusing the linearly polarized laser on a surface of the silicon wafer in the sample through an objective lens for irradiation, where an irradiation site of the laser is fixed, and a polarization direction of the laser is adjusted through a half-wave plate (HWP) to make fusiform nano-units with different orientations grow at the same site and thus obtain a spiral chiral nanostructure formed from superposition of the fusiform nano-units with different orientations.

<Growth to Form a Platinous/Palladium Oxide Chiral Structure II>

Further, the present disclosure also provides another method for laser polarization-induced growth to form a platinous or palladium oxide chiral structure, including the following steps:

step 1. preparation of a sample soaking a silicon wafer in an APTS solution for a few minutes, and cleaning the silicon wafer with deionized water; and adding an appropriate amount of a Pt or Pd precursor solution dropwise on the silicon wafer, and covering with a cover glass such that the silicon wafer is completely immersed in the Pt or Pd precursor solution to obtain the sample;

step 2. laser-induced growth to form a complex chiral pattern converting a linearly polarized laser into a mixed polarized laser by aligning the fast axis of a vortex plate in a degree ranging from 30° to 60° to the polarization, and focusing the mixed polarized laser on a surface of the silicon wafer in the sample through an objective lens for irradiation to obtain a chiral nanostructure composed of multiple fusiform nano-units.

Preferably, in the above-mentioned <growth of platinous/palladium oxide fusiform nano-pillars>, <growth of platinous/palladium oxide circular nano-pillars>, <growth to form a platinous/palladium oxide complex pattern>, <growth to form a platinous/palladium oxide chiral structure I>, and <growth to form a platinous/palladium oxide chiral structure II>, the irradiation laser may have a wavelength of 400 nm to 460 nm or 500 nm to 550 nm; when the laser wavelength of 400 nm to 460 nm is adopted, the irradiation power may be in a range of 2 mW to 6 mW and the irradiation time may be in a range of 10 s to 60 s; and when the laser wavelength of 500 nm to 550 nm is adopted, the irradiation power may be in a range of 8 mW to 22 mW and the irradiation time may be no less than 20 s. In particular, for the <growth to form a platinous/palladium oxide chiral structure I>, the irradiation time given here may correspond to a formation time of single fusiform nano-units.

Preferably, in the above-mentioned <growth of platinous/palladium oxide fusiform nano-pillars>, <growth of platinous/palladium oxide circular nano-pillars>, <growth to form a platinous/palladium oxide complex pattern>, <growth to form a platinous/palladium oxide chiral structure I>, and <growth to form a platinous/palladium oxide chiral structure II>, the Pt or Pd precursor may be an organic and inorganic precursor such as $K_2PtCl_4$, $K_2PtCl_6$, $K_2PdCl_6$ and $Pt(acac)_2$.

Function and Effect of the Present Disclosure

In the present disclosure, through a laser-induced photochemical reaction, a metal precursor undergoes photolysis to produce inorganic nanoparticles, and these nanoparticles are orientedly deposited on a substrate along a polarization direction in a linearly polarized laser to form fusiform nano-units. The generated fusiform gold nanoparticles have a long axis of about 300 nm to 400 nm and a short axis of about 100 nm; the generated platinous oxide fusiform pillars have a long axis of about 700 nm, a short axis of about 400 nm, and a height of 500 nm; and the above sizes can be adjusted by adjusting light conditions and precursor concentration. Through mixed polarized light generated by a vortex plate, the nano-units can grow rapidly and form a specific arrangement to obtain special 3D nanostructures with chiral features and complex patterns. This method can be implemented in a room temperature environment, has the characteristics of simple operation, short reaction time, high repeatability, long storage time, low cost, and controllable orientations and sites, which shows promising application prospects in the fields of optical devices, chiral catalysis, sensing, integrated circuits, and the like.

DETAILED DESCRIPTION OF THE EMBODIMENTS

Figure 1:
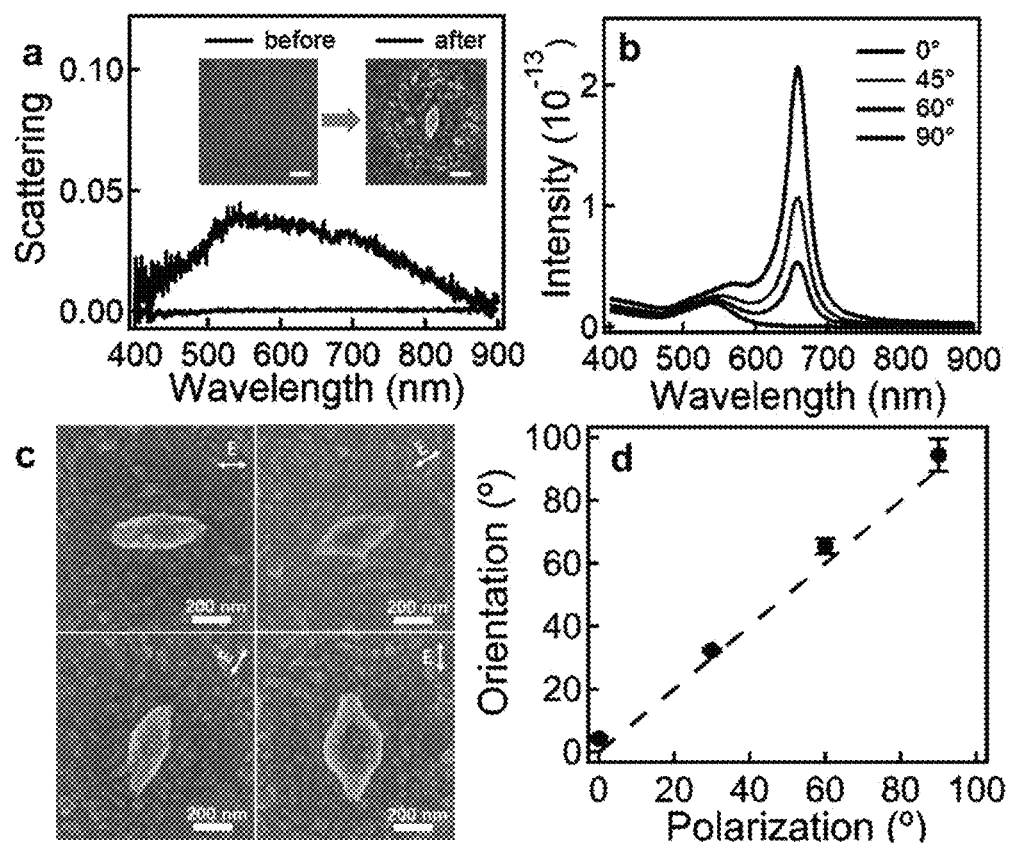
FIG. 1 shows test results of the test sample group 1[#] prepared in Example 1 of the present disclosure, where a dark-field scattering spectrum obtained after an $HAuCl_4$ solution is irradiated with a 446 nm laser for 15 s (with an irradiation power of 4 mW) is shown; (a) is a scanning electron microscopy (SEM) image; (b) shows a polarization dependent optical properties (simulation) of a single fusiform gold nanoparticle; (c) shows images of fusiform nanoparticles with different orientations induced by linearly polarized lasers with four polarization angles; and (d) shows a corresponding relationship between a growth orientation angle and a polarization direction of a laser.

Specific embodiments of the method for laser-induced growth of nano-units to form oriented, chiral, and complex structures involved in the present disclosure will be described in detail below with reference to the accompanying drawings.

Example 1

1) Preparation of a Gold Substrate

With a thermal evaporation instrument, a chromium layer of 3 nm was vapor-deposited on a silicon substrate as an adhesion layer, and then a gold layer of 100 nm was vapor-deposited to obtain a gold film. The prepared gold film substrate was cut into small pieces each of about 1 cm², and stored in a dry box.

2) Preparation of a Sample

A small piece of the gold film was taken, cleaned with alcohol, and blow-dried; an appropriate amount of a chloroauric acid solution (10 mmol/L to 20 mmol/L) was added dropwise on the gold film with a pipette; and then the gold film was covered with a cover glass such that the gold film was completely immersed in the chloroauric acid solution.

3) Laser-Induced Oriented Growth of Fusiform Gold Nanoparticles

A linearly polarized laser was coupled into an optical microscope and then focused on a surface of the gold film sample prepared in 2) through a 100× objective lens (numerical aperture: 0.8) for irradiation. The irradiation laser was linearly polarized light with a wavelength of 446 nm, an irradiation power could be adjusted in a range of 3 mW to 6 mW, and an irradiation time could be adjusted in a range of 15 s to 25 s.

A polarization direction of the laser could be changed to obtain fusiform gold nanoparticles with different orientations.

4) Laser Polarization-Induced Growth of Fusiform Gold to Form a Chiral/Complex Pattern The 446 nm linearly polarized light was converted into radially polarized light, angularly polarized light, and mixed polarized light using a vortex plate, and then focused on a surface of the gold film sample prepared in 2) through a 100× objective lens (numerical aperture: 0.8) for irradiation. An irradiation power could be adjusted in a range of 5 mW to 6 mW and an irradiation time could be adjusted in a range of 120 s to 180 s to finally form different chiral/complex patterns on the gold film.

Specifically, in this example, a 10 mmol/L HAuCl₄ solution was added dropwise. The gold film sample prepared in 2) was placed under a microscope, and under the same laser irradiation conditions (4 mW, 15 s), irradiation was conducted in varying polarization directions to obtain a test sample group 1#, where the varying polarization directions had included angles of 0°, 30°, 60°, and 90°, with a horizontal direction, respectively.

The gold film sample prepared in 2) was placed under a microscope, and irradiation was conducted with a 446 nm laser at a power of 4 mW for different times to obtain a test sample group 2#.

The gold film sample prepared in 2) was placed under a microscope, and the HAuCl₄ solution was irradiated for 120 s with radially polarized light and angularly polarized light of 446 nm and mixed polarized light of the two at an irradiation power of 5 mW to obtain a test sample group 3#.

Figure 2:
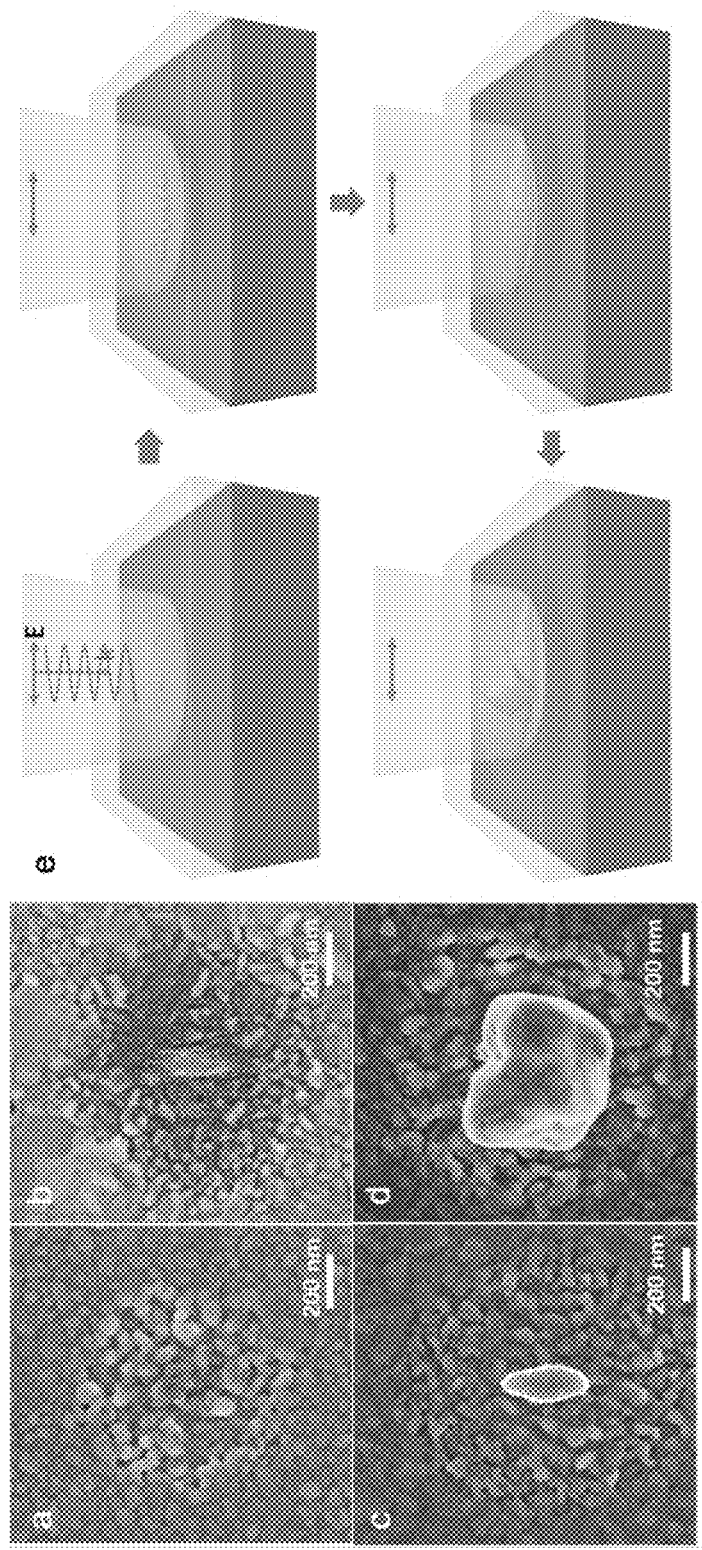
FIG. 2 shows test results of the test sample group 2[#] prepared in Example 1 of the present disclosure, where a laser with a wavelength of 446 nm is used and a power remains constant at 4 mW; and SEM images obtained under irradiation times of 10 s (a), 15 s (b), and 20 s (c), and 25 s (d) and a schematic diagram of a growth process of fusiform gold nanoparticles (e) are shown.
Figure 3:
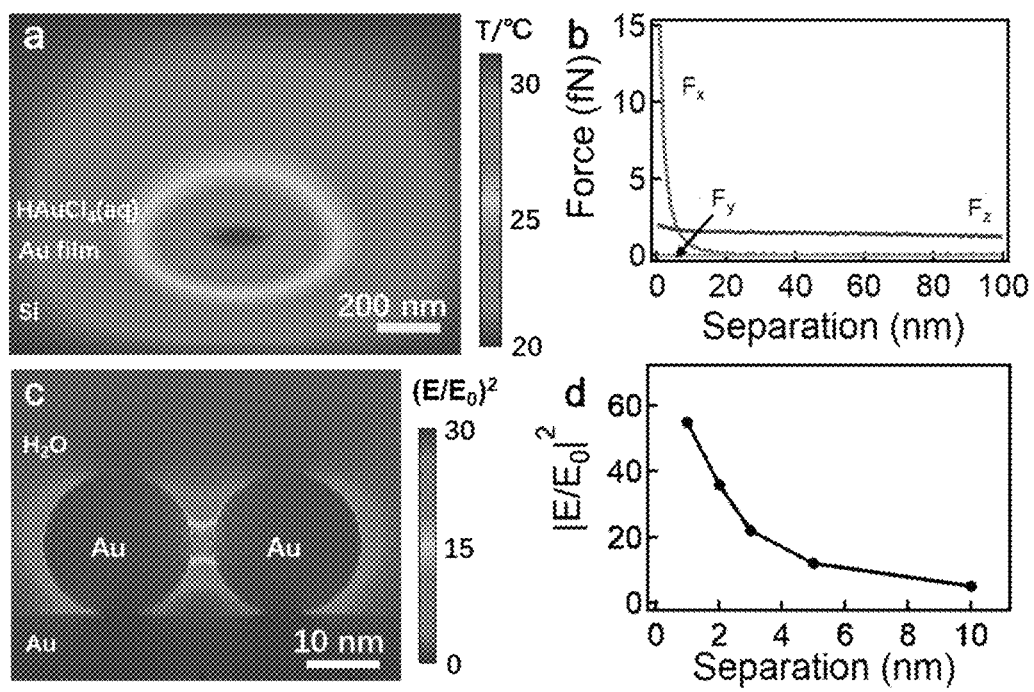
FIG. 3 shows a mechanism of polarized laser-induced growth of fusiform nanoparticles prepared in Example 1 of the present disclosure, where (a) is a temperature simulation diagram for the irradiation of a gold film with a 446 nm laser at a power of 4 mW; (b) is a simulation diagram illustrating the change of an optical force with a spacing between two gold spherical particles; (c) is a near electric field simulation diagram for two gold nanoparticles with a spacing of 3 nm, with an excitation wavelength of 446 nm; and (d) shows the change of the maximum light field intensity at a center between two particles with the change of a spacing between the two particles.

SEM images of the obtained fusiform gold nanostructure test samples (No. 1#), change of growth of the fusiform gold nanostructure with time (No. 2#), and temperature and electric field simulation diagrams were shown in FIG. 1 to FIG. 3. SEM images of the obtained gold nano-complex pattern and chiral structure samples (No. 3#) were shown in FIG. 4.

FIG. 1 showed fusiform gold nanoparticles obtained after irradiation was conducted for 15 s with a 446 nm laser at an irradiation power of 4 mW. It can be seen from the polarization scattering simulation images at different angles that the fusiform gold nanoparticles grown on the surface of the gold film were polarization-dependent. By adjusting the polarization direction of the laser through an HWP, it can be found that an orientation of the grown fusiform nanoparticles was basically consistent with a polarization direction of the linearly polarized light.

FIG. 2 showed a morphology evolution process of gold nanoparticles as irradiation time increased when a 446 nm laser was used to conduct irradiation at an irradiation power of 4 mW. At an initial stage of irradiation, pits were etched on the surface of the gold film by the chloroauric acid solution with the aid of the laser, and the laser induced the reduction of chloroauric acid to form gold spherical particles with a diameter of about 10 nm in the solution; and the gold nanospheres were arranged along the polarization direction of the laser under the action of an optical force, and underwent oriented photochemical growth under the action of a polarization-excited near field to finally form fusiform nanoparticles. As the irradiation time of the laser extended, due to the reduction of chloroauric acid and the increased generation rate of gold atoms, large single crystals were formed on the fusiform nanoparticles under the control of kinetics.

FIG. 3 showed a mechanism affecting the growth of gold nanospheres along the polarization direction of the laser. It can be seen from the temperature simulation diagram that the highest temperature was about 30° C., and thus etched pits were formed on the surface of the gold film not because of the promotion of heating for the oxidative etching on the surface of the gold film, but because of the photochemicallyinduced oxidative etching. The resulting temperature gradient was also not the main factor for the aggregation of gold spherical nanoparticles. The gold spherical particles were orientally arranged on the surface of etched rough pits under the action of the optical force (FIG. 3b). There was an obvious near-field enhancement effect among these particles (FIG. 3c). The gold nanoparticles would preferentially grow along the polarization direction of the laser to form fusiform nanoparticles.

Figure 4:
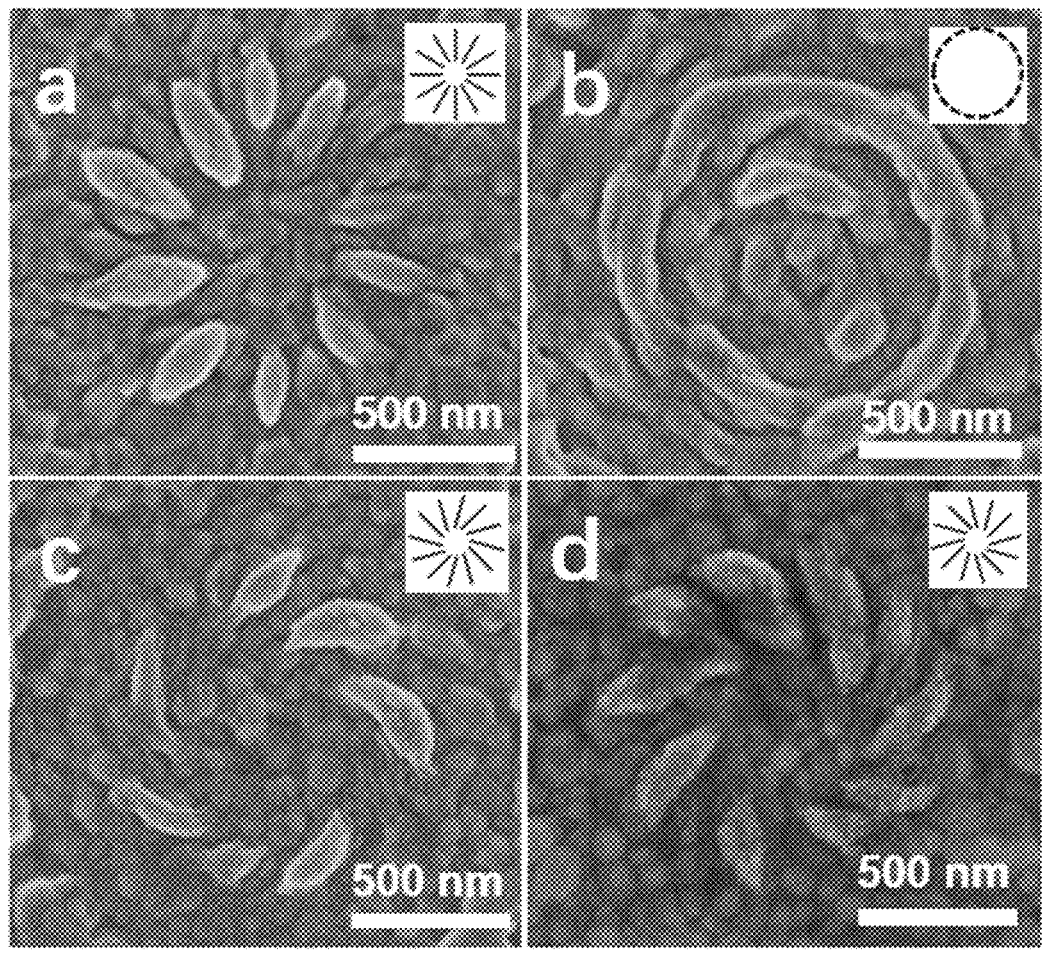
FIG. 4 shows SEM images of the test sample group 3[#] prepared in Example 1 of the present disclosure, where the test sample group is obtained after an $HAuCl_4$ solution is irradiated for 120 s with radially polarized light and angularly polarized light of 446 nm and mixed polarized light of the two, with an irradiation power of 5 mW; and (a) is for the radial polarization, (b) is for the angular polarization, (c) is for the mixed polarization (−60°), and (d) is for the mixed polarization (60°).

FIG. 4 showed complex patterns and chiral nanostructures grown on the surface of the gold film after the $HAuCl_4$ solution was irradiated with lasers of different polarization features. The polarization direction of the 446 nm linearly polarized laser was adjusted to be parallel to a fast axis direction of the vortex plate to obtain radially polarized light, and a nanostructure induced by the radially polarized light (5 mw, 120 s) was shown in FIG. 4a, where multiple fusiform nano-units constituted a radial flower-like structure, and an inner circle enclosed by inner ends of the fusiform nano-units had a diameter of greater than 200 nm. The polarization direction of the 446 nm linearly polarized laser was adjusted to be perpendicular to the fast axis direction of the vortex plate to obtain angularly polarized light, and a nanostructure induced by the angularly polarized light (5 mw, 120 s) was shown in FIG. 4b, where multiple fusiform nano-units were connected along a circumferential direction to form a ring. When the polarization direction of the linearly polarized light was at an included angle other than 90° with the fast axis direction of the vortex plate, mixed polarized light was obtained. When the polarization direction of the linearly polarized light was at included angles of −60° and 60° with the fast axis direction of the vortex plate, a mixed polarized light power was set as 5 mW and an irradiation time was set as 120 s to obtain the chiral structures of FIG. 4c and FIG. 4d, respectively, where multiple curved fusiform nano-units constituted a radial flower-like structure. In FIG. 4c, the fusiform nano-units curved in a clockwise direction and fusiform nano-units located at the right side had a large volume; and in FIG. 4d, the fusiform nano-units curved in a counterclockwise direction and the fusiform nano-units located at the upper side had a large volume. The included angle between the polarization direction of the linearly polarized light and the fast axis direction of the vortex plate could be adjusted to further adjust the helicity of a structure.

Example 2

1) Preparation of a Sample

A silicon wafer of 1 cm² was taken, rinsed with alcohol, and then blow-dried. 1 μL of APTS was pipetted with a pipette and added to 1 mL of deionized water, and a resulting mixture was thoroughly mixed to obtain an APTS solution. The cleaned silicon wafer was soaked in the APTS solution for 10 min, and then cleaned with deionized water, such that laser-induced platinous oxide nanoparticles could be firmly adsorbed on the substrate. An appropriate amount of a $K_2PtCl_4$ solution (5 mmol/L to 30 mmol/L) was added dropwise on the treated silicon wafer, and then the silicon wafer was covered with a cover glass such that the silicon wafer was completely immersed in the $K_2PtCl_4$ solution.

2) Laser-Induced Oriented Growth of Platinous Oxide Pillars

A linearly polarized laser was coupled into an optical microscope and then focused on a surface of the silicon substrate through a 100× or 50× objective lens (numerical aperture: 0.8 or 0.5) for irradiation. The irradiation laser may have a wavelength of 446 nm or 532 nm. When a laser with a wavelength of 446 nm was used for irradiation, an irradiation power was in a range of 2 mW to 6 mW and an irradiation time was in a range of 10 s to 60 s. When a laser with a wavelength of 523 nm was used for irradiation, an irradiation power was in a range of 8 mW to 22 mW and an irradiation time was no less than 20 s. Under the above irradiation conditions, fusiform nano-pillars with an obvious orientation could be obtained. When the 446 nm laser was used for irradiation (3 mW, 30 s), a polarization direction of the linearly polarized laser could be changed to obtain fusiform nano-pillars with different orientations. Under the same light conditions, the linearly polarized light was adjusted into circularly polarized light with a quarter wave plate to induce the generation of circular pillars.

3) Laser Polarization-Induced Chiral Growth of Platinous Oxide Fusiform Pillars

A laser with a wavelength of 446 nm was selected, a laser power was preferably controlled in the range of 2 mW to 3 mW, and an irradiation time was preferably controlled in the range of 8 s to 15 s. The irradiation site and power of the laser were fixed, and the polarization direction of the laser was adjusted through an HWP to make fusiform nano-pillars with different orientations grow at the same site, such that a spiral chiral nanostructure obtained from superposition of the fusiform nano-pillars with different orientations.

4) Laser Polarization-Induced Growth of Platinous Oxide Pillars to Form a Chiral/Complex Pattern The 446 nm linearly polarized light was converted into radially polarized light, angularly polarized light, and mixed polarized light using a vortex plate, and then focused on a surface of the silicon substrate prepared in 1) through a 100× objective lens (numerical aperture: 0.8) for irradiation. An irradiation power could be adjusted in a range of 4 mW to 6 mW and an irradiation time could be adjusted in a range of 60 s to 90 s to finally form different chiral/complex patterns on the silicon substrate.

Specifically, in Example 2, a 20 mmol/L potassium tetrachloroplatinate solution was used. The sample obtained in 1) was placed under a microscope, and linearly polarized and circularly polarized lasers (with a wavelength of 446 nm) each were used for irradiation to obtain a test sample group 4#.

The sample obtained in 1) was placed under a microscope, a laser with a wavelength of 446 nm was used for irradiation, and the polarization direction of the laser was changed (0°, 45°, 90°, and 180°) to obtain a test sample group 5#.

The sample obtained in 1) was placed under a microscope, a laser with a wavelength of 446 nm was used for irradiation, and the polarization direction of the laser was changed (0°, 120°, and 240°) to conduct irradiation multiple times at the same site to obtain a test sample group 6#.

The sample obtained in 1) was placed under a microscope, the 446 nm linearly polarized light was converted into radially polarized light, angularly polarized light, and mixed polarized light with a vortex plate, and then the potassium tetrachloroplatinate solution was irradiated with these three kinds of polarized light to obtain a test sample group 7#.

SEM images of the obtained platinous oxide nanostructure samples (No. 4-7#) were shown in FIG. 5 to FIG. 8, respectively.

Figure 5:
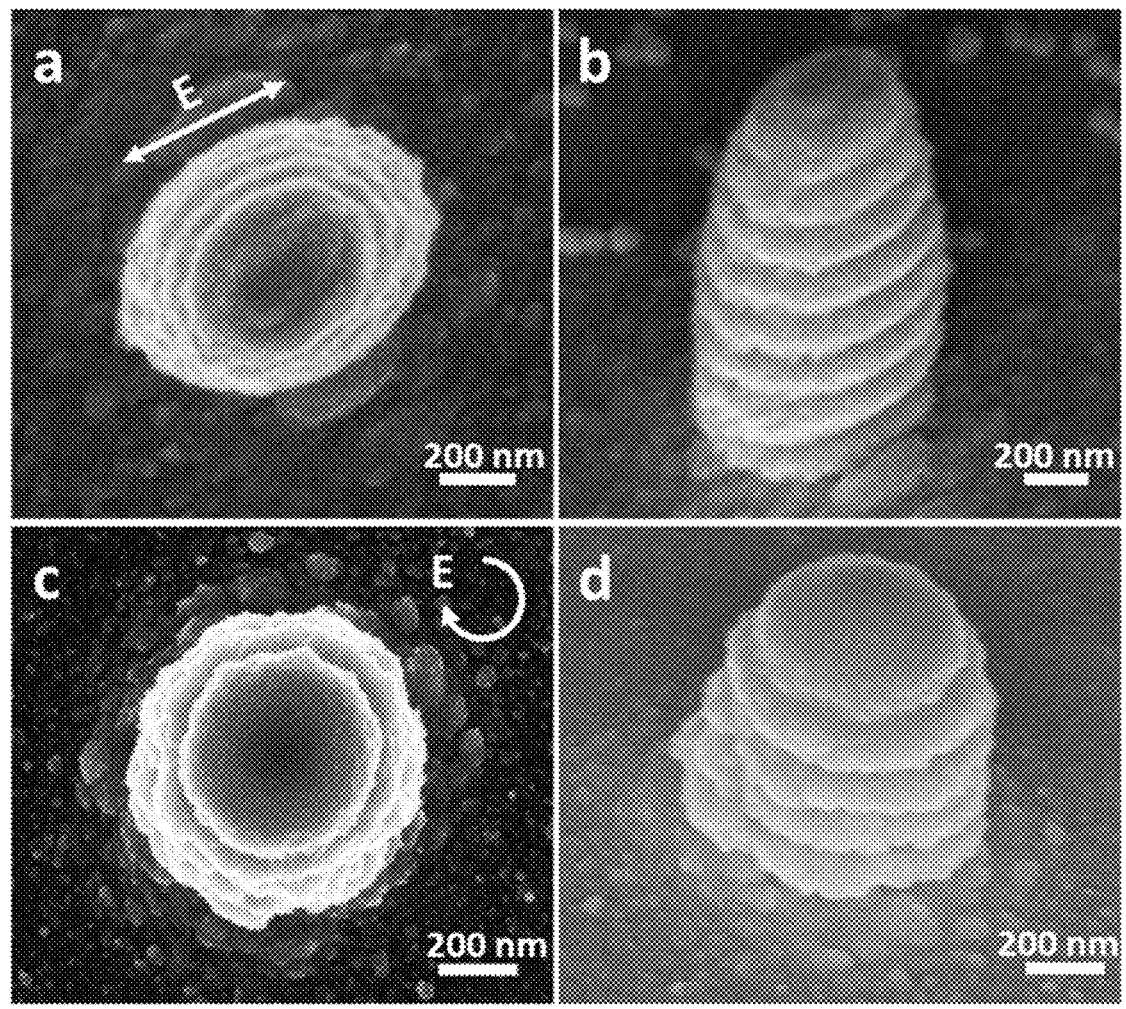
FIG. 5 shows SEM images of the test sample group 4[#] prepared in Example 2 of the present disclosure, where (a) is a top view and (b) is a corresponding side view at an inclination angle of 45° for a test sample obtained after a $K_2PtCl_4$ solution is irradiated for 10 s with a linearly polarized laser of 446 nm, with an irradiation power of 3 mW; and (c) is a top view and (d) is a corresponding side view at an inclination angle of 45° for a test sample obtained after a $K_2PtCl_4$ solution is irradiated for 10 s with a circularly polarized laser of 446 nm, with an irradiation power of 3 mW.

FIG. 5 showed nanoparticles with different morphologies obtained after the $K_2PtCl_4$ solution was irradiated for 10 s with linearly polarized light and circularly polarized light of the laser with a wavelength of 446 nm (3 mW). Nanoparticles obtained from linearly polarized light-induced growth were fusiform and columnar, and had a long axis parallel to the polarization direction of the laser. Particles obtained from circularly polarized light-induced growth were cylindrical.

Figure 6:
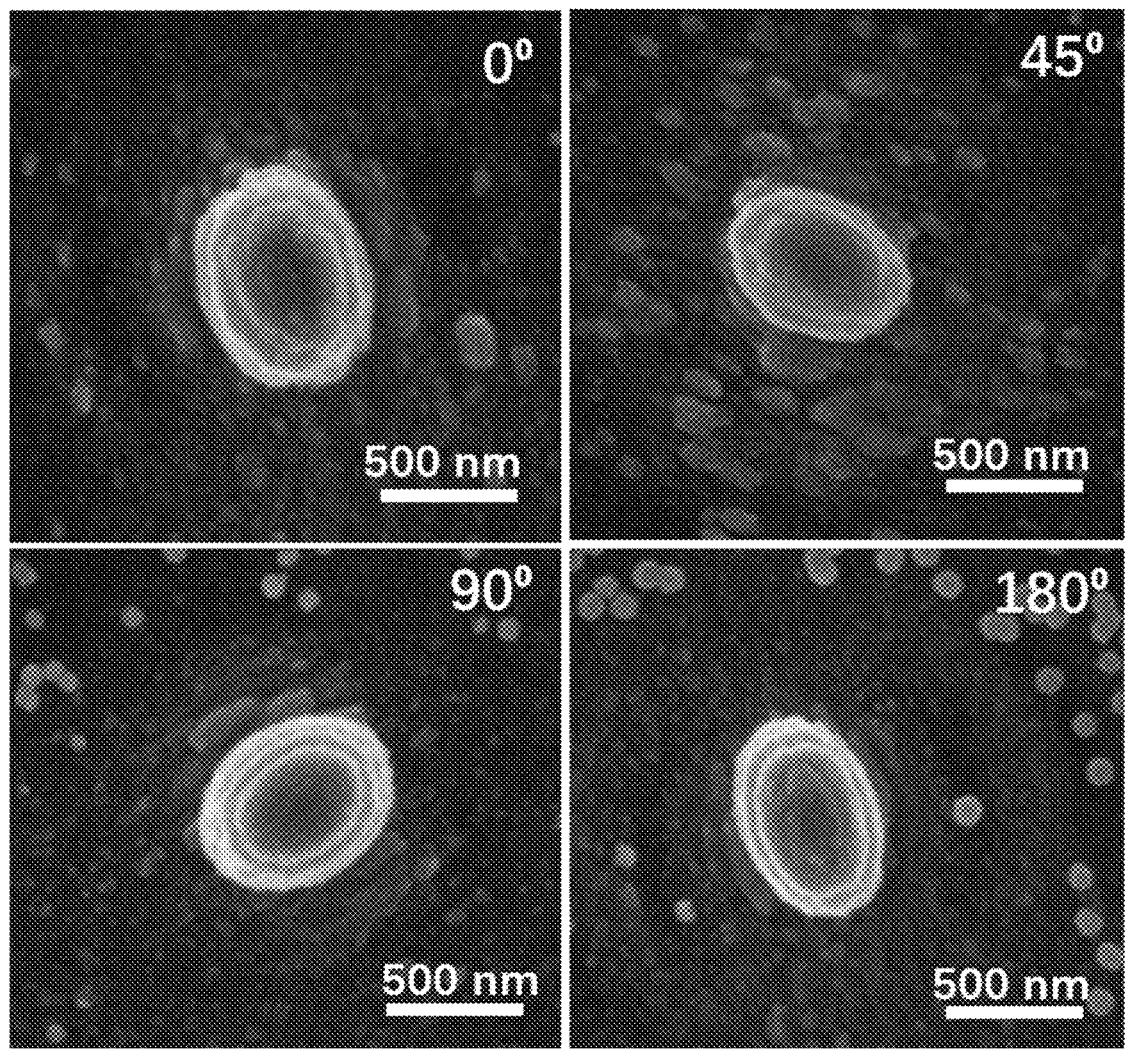
FIG. 6 shows SEM images of the test sample group 5[#] prepared in Example 2 of the present disclosure, where the test sample group includes fusiform columnar platinous oxide nanoparticles with different orientations obtained after irradiation is conducted for 30 s with a linearly polarized laser (3 mW) of 446 nm at varying polarization directions (0°, 45°, 90°, and 180°).

FIG. 6 showed fusiform cylindrical nanoparticles with a long axis parallel to a corresponding polarization direction of a laser, where the linearly polarized laser with a wavelength of 446 nm (3 mW) was used for irradiation, and the polarization direction of the linearly polarized laser was changed through an HWP.

Figure 7:
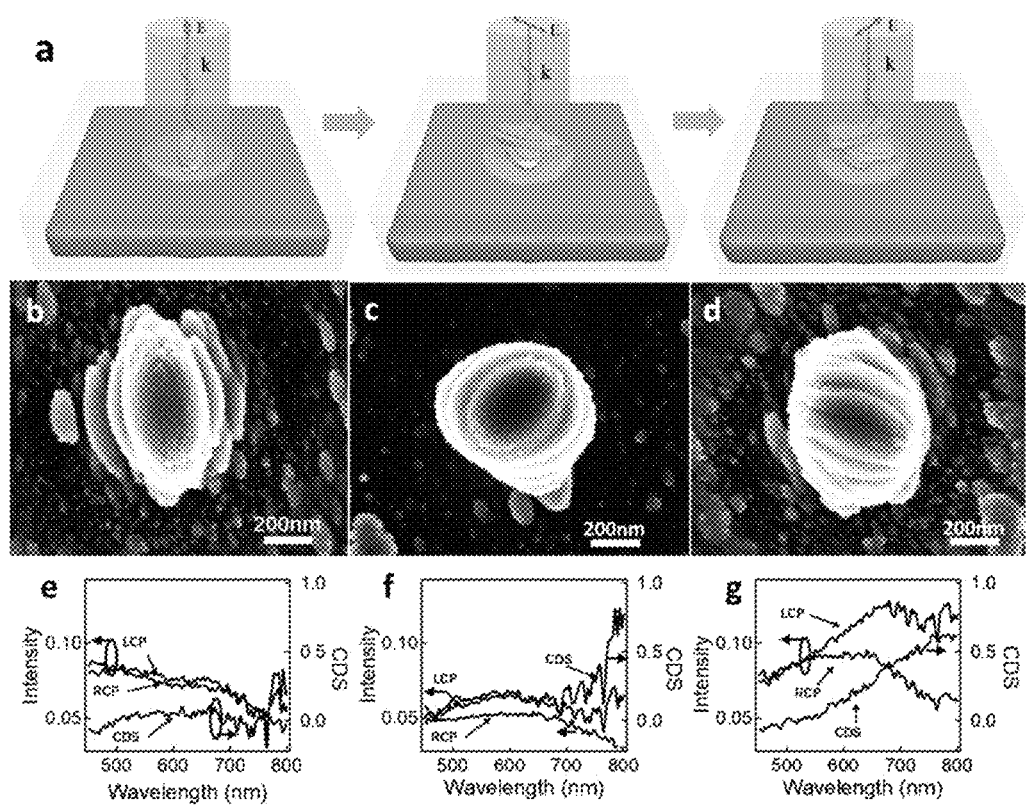
FIG. 7 shows test results of the test sample group 6# prepared in Example 2 of the present disclosure, where the test sample group includes chiral nanoparticles of a spiral structure prepared by continuously changing the irradiation polarization direction in situ according to the method of preparing anisotropic nanoparticles; (a) is a schematic diagram of chiral particle growth; (b) to (d) show the platinous oxide nanoparticles obtained after irradiation is conducted once, twice, and three times in different polarization directions, respectively; and (e) to (g) show scattering spectra and circular dichroic scattering (CDS) spectra corresponding to the test samples of (b) to (d), respectively. LCP: left circular polarization, RCP: right circular polarization.

FIG. 7 showed spiral chiral nanostructures obtained from irradiation with a 446 nm laser, where the irradiation site and the irradiation power (2 mW) of the laser were fixed, and the polarization direction of the laser was changed. An irradiation process was shown in FIG. 7a. The $K_2PtCl_4$ solution was first irradiated for 15 s to obtain fusiform PtO oriented along the polarization direction (FIG. 7b); then an HWP was rotated by 60° to make the polarization direction of the laser at an included angle of 120° with the original polarization direction, and irradiation was conducted for 8 s to obtain a sample resulting from superposition of nano-pillars with two different orientations (FIG. 7c); and the HWP was rotated by 60° once again, and irradiation was conducted for 5 s to obtain a spiral sample resulting from superposition of nano-pillars with three different orientations (FIG. 7d). Because the sample in FIG. 7d had obvious spiral characteristics, a scattering spectrum thereof showed obvious optical chiral characteristics in the visible and even near-infrared bands (FIG. 7g), and a CDS value thereof was up to 60%. For the PtO nanostructures obtained after the two rotations, the spiral features were weak, and thus the circular dichroism features only showed a high CDS value at 800 nm. The fusiform PtO structure (FIG. 7b) did not show chiral features, and a CDS value thereof was close to 0 throughout the entire spectrum.

Figure 8:
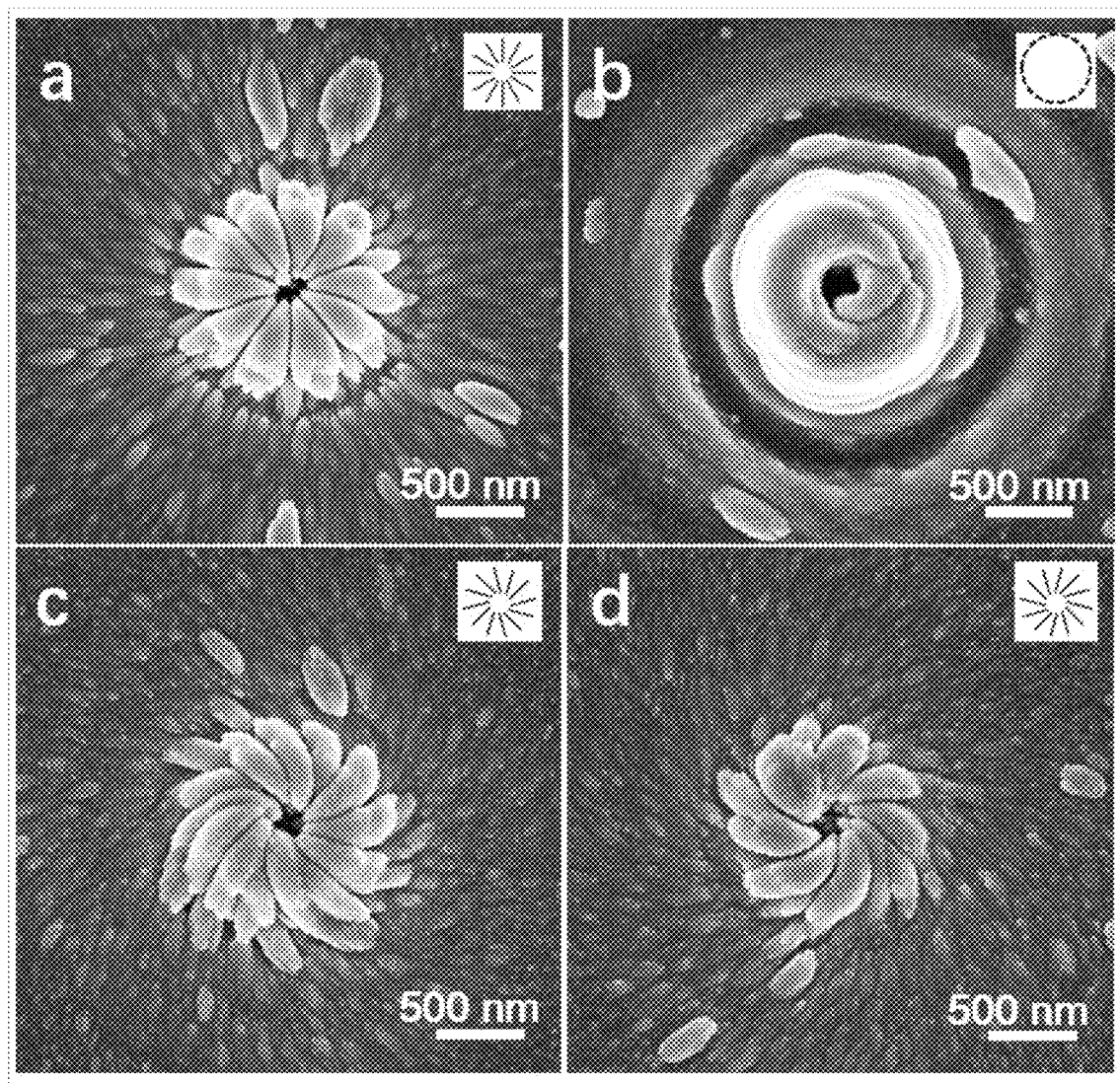
FIG. 8 shows SEM images of the test sample group 7# prepared in Example 2 of the present disclosure, where the test sample is obtained after a potassium tetrachloroplatinate solution is irradiated for 60 s with radially polarized light and angularly polarized light of 446 nm and mixed polarized light of the two, with an irradiation power of 4 mW; and (a) is for the radial polarization, (b) is for the angular polarization, (c) is for the mixed polarization (30°), and (d) is for the mixed polarization (−30°).

FIG. 8 showed nanostructures obtained from growth induced by radially polarized light, angularly polarized light, and mixed polarized light. The polarization direction of the 446 nm linearly polarized laser was adjusted to be parallel to the fast axis direction of the vortex plate to obtain radially polarized light, and a nanostructure induced by the radially polarized light (4 mw, 60 s) was shown in FIG. 8a, which was a densely-arranged multi-layered flower-like structure. The polarization direction of the 446 nm linearly polarized laser was adjusted to be perpendicular to the fast axis direction of the vortex plate to obtain angularly polarized light, and a nanostructure induced by the angularly polarized light (4 mw, 60 s) was shown in FIG. 8b, where multiple layers of curved fusiform nano-units overlapped one another to form a ring. When the polarization direction of the linearly polarized light was at an included angle other than 90° with the fast axis direction of the vortex plate, mixed polarized light was obtained. When the polarization direction of the linearly polarized light was at included angles of 30° and −30° with the fast axis direction of the vortex plate, a mixed polarized light power was set as 4 mW and an irradiation time was set as 60 s to obtain the chiral structures of FIG. 8c and FIG. 8d, respectively, where multiple curved fusiform nano-units were densely arranged to form a multi-layered flower-like structure. In FIG. 8c, the fusiform nano-units curved in a counterclockwise direction; and in FIG. 8d, the fusiform nano-units curved in a clockwise direction. The included angle between the polarization direction of the linearly polarized light and the fast axis direction of the vortex plate could be adjusted to further adjust the helicity of a structure.

The above examples merely illustrate the technical solutions of the present disclosure. The method for laser-induced growth of nano-units to form oriented, chiral, and complex structures involved in the present disclosure is not only limited to contents described in the above examples, but is subject to a scope defined by the claims. Any modifications, supplementations, or equivalent replacements made by a person skilled in the part based on the examples shall fall within the protection scope of the present disclosure.

What is claimed is:

1. A method for laser polarization-induced growth of fusiform gold nano-units, comprising the following steps:
   step 1. preparation of a gold substrate
      with a thermal evaporation instrument, vapor-depositing chromium on a silicon substrate as an adhesion layer, and vapor-depositing a gold layer to obtain a gold film on the adhesion layer; and cutting an entire structure consisting of the silicon substrate, the adhesion layer and the gold film into pieces, and storing the pieces in a dry box for further use;
   step 2. preparation of a sample
      taking a piece of the entire structure, adding a chloroauric acid solution dropwise on the gold film with a pipette, and covering with a cover glass such that the gold film is completely immersed in the chloroauric acid solution to obtain the sample;
   step 3. laser-induced oriented growth of single fusiform gold nanoparticles
      coupling a linearly polarized laser into an optical microscope, and focusing the linearly polarized laser on a surface of the gold film in the sample through an objective lens to conduct irradiation for 10 s to 25 s at an irradiation power of 3 mW to 6 mW, and adjusting a direction of the linearly polarized laser to obtain gold fusiform nanoparticles with a corresponding orientation.

2. The method according to claim 1, further comprising the following steps:
   step 4. laser polarization-induced chiral growth of fusiform gold
   converting 446 nm linearly polarized light into mixed polarized light by aligning a fast axis of a vortex plate in a degree ranging from 30° to 60° to the polarization, and focusing the mixed polarized light on a surface of the gold film in the sample through an objective lens to conduct irradiation for 90 s to 180 s at an irradiation power of 5 mW to 6 mW to obtain a chiral nanostructure composed of multiple fusiform gold nano-units.

3. The method according to claim 1, further comprising the following steps:
   step 5. laser polarization-induced growth of fusiform gold nano-units to form a complex pattern
   converting linearly polarized light into radially or angularly polarized light by aligning a fast axis of a vortex plate either parallel or vertical to the polarization, and focusing the radially or angularly polarized light on a surface of the gold film in the sample through an objective lens to conduct irradiation for 90 s to 180 s at an irradiation power of 5 mW to 6 mW to obtain a complex pattern nanostructure composed of multiple fusiform gold nano-units.

4. The method according to claim 1, wherein in step 1, a chromium layer of 3 nm is first vapor-deposited as an adhesion layer, and then a gold layer of 50 nm to 100 nm is vapor-deposited.

5. The method according to claim 1, wherein in step 3, the laser has a wavelength of 400 nm to 460 nm.

* * * * *